US 6,622,197 B1

(12) United States Patent
Kim

(10) Patent No.: US 6,622,197 B1
(45) Date of Patent: Sep. 16, 2003

(54) DYNAMIC RANDOM ACCESS MEMORY DEVICE CAPABLE OF PROGRAMMING A REFRESH PERIOD AND A BIT ORGANIZATION

(75) Inventor: Jae-Hoon Kim, Kyunggi-do (KR)

(73) Assignee: Samsung Electronics Co., Ltd., Kunggi-do (KR)

( * ) Notice: Subject to any disclaimer, the term of this patent is extended or adjusted under 35 U.S.C. 154(b) by 14 days.

(21) Appl. No.: 09/596,836

(22) Filed: Jun. 19, 2000

(30) Foreign Application Priority Data

Jun. 17, 1999 (KR) .......................................... 99-22734

(51) Int. Cl.[7] ............................................. G06F 12/00
(52) U.S. Cl. ................ 711/100; 365/230.03; 365/238.5
(58) Field of Search ................................. 711/202, 100, 711/106; 365/203, 222, 233, 238.5

(56) References Cited

U.S. PATENT DOCUMENTS

| 5,600,605 | A | * | 2/1997 | Schaefer | 365/233 |
| 5,761,703 | A | * | 6/1998 | Bolyn | 711/106 |
| 6,067,597 | A | * | 5/2000 | Kozaru | 711/100 |
| 6,141,288 | A | * | 10/2000 | Numata et al. | 365/230.03 |
| 6,151,270 | A | * | 11/2000 | Jeong | 365/233 |
| 6,199,025 | B1 | * | 3/2001 | Fujii et al. | 702/117 |
| 6,219,292 | B1 | * | 4/2001 | Jang | 365/222 |

* cited by examiner

*Primary Examiner*—Do Hyun Yoo
*Assistant Examiner*—Nasser Moazzami
(74) *Attorney, Agent, or Firm*—Harness, Dickey & Pierce, P.L.C.

(57) ABSTRACT

A dynamic random access memory device includes a mode register set, a refresh period selector, and a bit organization selector. The mode register set outputs decoded signals having values according to a user-stored value in the mode register set. The mode register set can be accessed in response to an address externally supplied when a mode set command is applied. The refresh period selector generates a plurality of refresh period select signals in response to the decoded signals. A refresh counter in the device generates a sequence of row addresses having a timing according to a refresh period determined from an activated refresh period select signal. The bit organization select circuit generates a plurality of bit organization select signals in response to the decoded signals from the mode register set. A data output multiplexer in the device selects some of the read data bits according to a bit organization determined by one of the bit organization select signals.

10 Claims, 5 Drawing Sheets

DYNAMIC RANDOM ACCESS MEMORY DEVICE CAPABLE OF PROGRAMMING A REFRESH PERIOD AND A BIT ORGANIZATION

CROSS-REFERENCE TO RELATED APPLICATION

This application claims the priority of Korean Patent Application No. 99-22734, filed on Jun. 17, 1999, the contents of which are herein incorporated by reference in their entirety.

FIELD OF THE INVENTION

The present invention relates to semiconductor integrated circuit devices, and in particular to a dynamic random access memory device having a programmable refresh period and/or a programmable bit organization.

BACKGROUND OF THE INVENTION

Dynamic random access memory circuits (DRAMs) are "dynamic" in that the stored data, typically represented by charged and discharged capacitors or memory cells, dissipate after a relatively short period of time. Thus, to retain the information, the stored data in the DRAM must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

FIG. 1 is a block diagram of a conventional dynamic random access memory device 1. In FIG. 1, an array 10 includes a plurality of memory cells (not shown), which are typically arranged in rows and columns such that a particular memory cell may be addressed by specifying the memory cell's row and column within the array. A signal on a word line, which a row decoder 20 selects according to an address from a row address buffer 16, turns on pass transistors in a selected row of memory cells to connect the memory cells to sense amplifiers 30 that detect the data in the memory cells. In a read operation, a data output multiplexer 32 chooses some of the data signals from the sense amplifiers 30 according to a predetermined bit organization of the memory device, and then the data thus chosen is output via a data output buffer 34. A bit organization select circuit 80 is an option circuit that determines the bit organization of the memory device.

A refresh operation is similar to a read operation but does not output data. The sensing of the data in the cells by the sense amplifiers 30 simultaneously rewrites the data to the cells. The data in the selected row of memory cells is thus "refreshed". A row address for the refresh operation is from a refresh counter 18. A refresh period select circuit 50 is an option circuit that determines an interval or period between refresh operations, and the refresh counter 18 internally generates a row address according to the refresh period determined by the refresh period select circuit 50.

FIG. 2 is a circuit diagram of the refresh period select circuit 50. The refresh period select circuit 50 includes a PMOS transistor 52, a fuse 54 (e.g., a laser fuse or an electric fuse), NMOS transistors 56, 58, and 60, and inverters 62, 64, 66, and 68 connected as illustrated in FIG. 2. The refresh period select circuit 50 outputs a select signal RFS for determining a refresh period of the memory device, for example, a 1 K-refresh period, a 2 K-refresh period, or a 4 K-refresh period. A logic level of the select signal RFS depends on whether the fuse 54 is intact or open. This configuration does not permit a change of the refresh period after the fuse 54 is cut or blown.

FIG. 3 is a circuit diagram of the bit organization select circuit 80. The bit organization select circuit 80 is coupled to an option pad, and includes NMOS transistors 82 and 90, PMOS transistors 84, 86, and 88, a resistor RI, and inverters 92, 94, and 96 connected as illustrated in FIG. 3. The bit organization select circuit 80 outputs a select signal IOS for determining a bit organization of the memory device, for example, ×1, ×4, ×8, or ×16. A logic level of the select signal IOS is according to a potential of the option pad, which a metal option connects to either a power supply voltage or a ground voltage. This configuration does not permit a change in the bit organization of the memory device because a metal option selects the bit organization.

As a result, since an option circuit that uses a fuse or a pad and a metal option determines the refresh period and the bit organization, the conventional memory device cannot change the refresh period or the bit organization when necessary.

SUMMARY OF THE INVENTION

In accordance with an aspect of the invention, a dynamic random access memory can program and change a bit organization and a refresh period.

One embodiment of the invention is a memory device that includes: an array of memory cells arranged in rows and columns; a row selector that selects one of the rows in response to a row address; a first generator of a plurality of refresh period select signals; and a second generator of the row address according to a refresh period during a refresh operation. The first generator responds to a mode set command and an address to determine which of the refresh period select signals are activated. The refresh period is determined by an activated one of the refresh period select signals.

In this embodiment, the means for generating a plurality of refresh period select signals typically includes a mode register set. The mode register set can be programmed according to the address supplied at an input of the mode set command, and the mode register set circuit outputs decoded signals for a refresh period set. The means for generating a plurality of refresh period select signals can further include a signal generator. The signal generator receives the decoded signals and outputs the refresh period select signals in response thereto, wherein a value stored in the mode register set determines which one of the refresh period select signals is activated.

BRIEF DESCRIPTION OF THE DRAWINGS

A more complete appreciation of the present invention, and many of the attendant advantages thereof, will become readily apparent as the same becomes better understood by reference to the following detailed description when considered in conduction with the accompanying drawings in which like reference symbols indicate the same or similar components, wherein.

DESCRIPTION OF THE PREFERRED EMBODIMENT

An exemplary embodiment of the invention will be more fully described with reference to the attached drawings.

Figure 4:
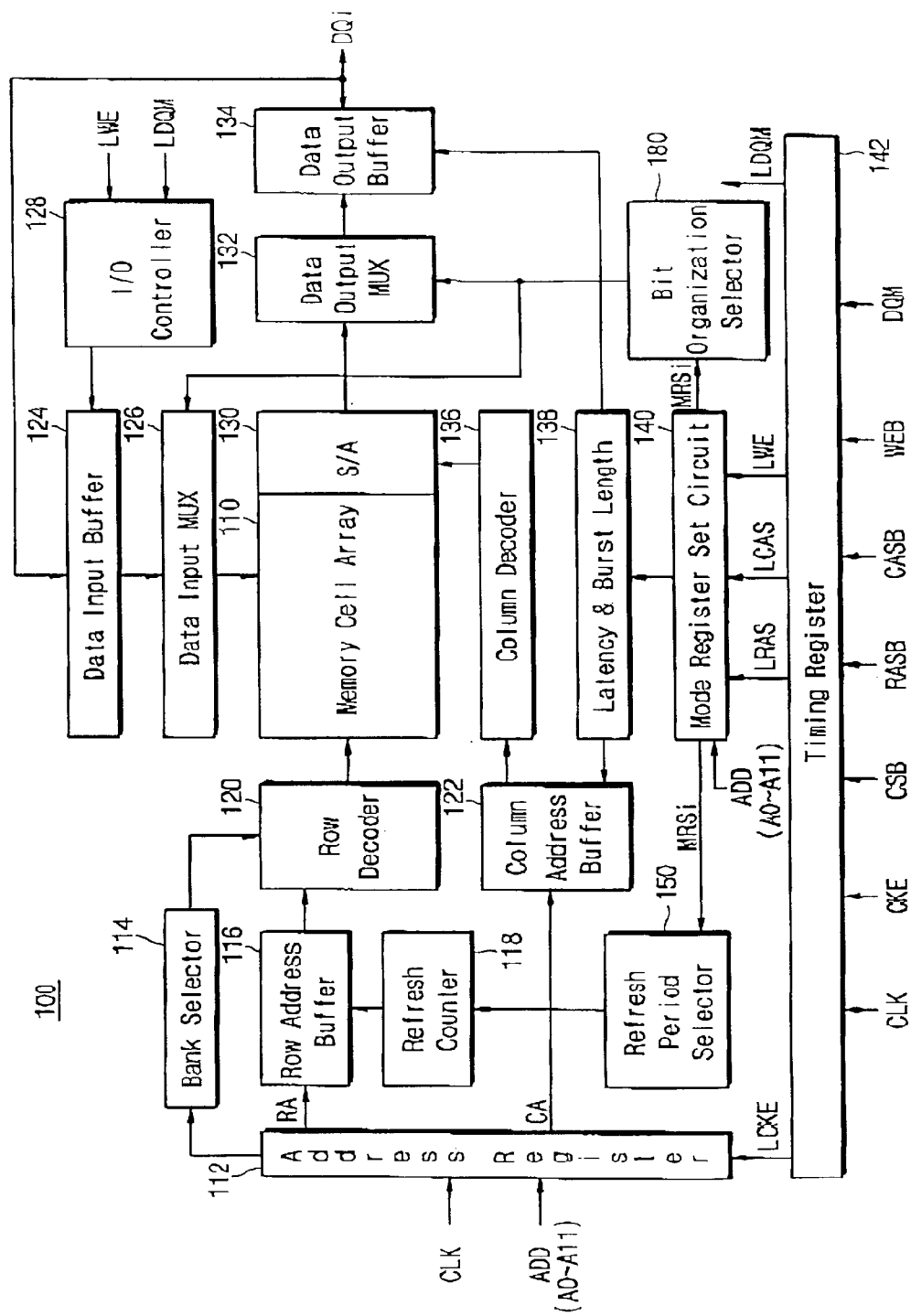
FIG. 4 shows a dynamic random access memory device according to an embodiment of the present invention.

FIG. 4 shows a dynamic random access memory device 100 according to the exemplary embodiment of the present invention. Memory 100 includes a memory cell array 110, an address register 112, a bank selector 114, a row address buffer 116, a refresh counter 118, a row decoder 120, a column address buffer 122, a data input buffer 124, a data input multiplexer 126, an input/output (I/O) controller 128, sense amplifiers 130, a data output multiplexer 132, a data buffer 134, a column decoder 136, a latency and burst length controller 138, a mode register set 140, a timing register 142, a refresh period selector 150, and a bit organization selector 180. The memory device 100 is substantially the same as the memory device 1 of FIG. 1 except for a refresh period select circuit 150 and a bit organization select circuit 180, which the mode register set (MRS) circuit 140 controls. Since remaining constituent elements are not critical to the invention and are known in the art, further description thereof is omitted.

The mode register set circuit 140 includes a register that is programmed after power-on and before normal operation. Contents in the mode register set circuit 140 indicates a burst length, a burst sequence type, a/CAS latency, the operational mode (whether normal operation or test mode), a refresh period, and a bit organization for data I/O. In an exemplary embodiment of the invention, the mode register set circuit 140 is programmed according to address signals A0–A11 in response to a mode set command, which occurs when control signals CSB, CASB, RASB and WEB simultaneously transition from a low level to a high level. Other methods for programming a register set are known and could alternatively be used. After programming, the mode register set circuit 140 produces decoded signals MRSi according to the refresh period and bit organization values programmed into the mode register set 140. The refresh period select circuit 150 receives the signals MRSi from the MRS 140 and generates multiple refresh period select signals. One of the refresh period select signals is activated to select a refresh period, for example, 1 K, 2 K or 4 K, from a set of available options for the refresh period. Similarly, the bit organization select circuit 180 receives the decoded signals MRSi from the mode register set 140 and generates multiple bit organization select signals. One of the bit organization select signals is activated to select a bit organization, for example, ×1, ×4, ×8 or ×16, from a set of available options for the bit organization. Accordingly, a refresh period of the refresh counter 118 and a bit organization of data input and output multiplexers 126 and 132 change according the programming of the mode register set circuit 140.

Figure 5A:
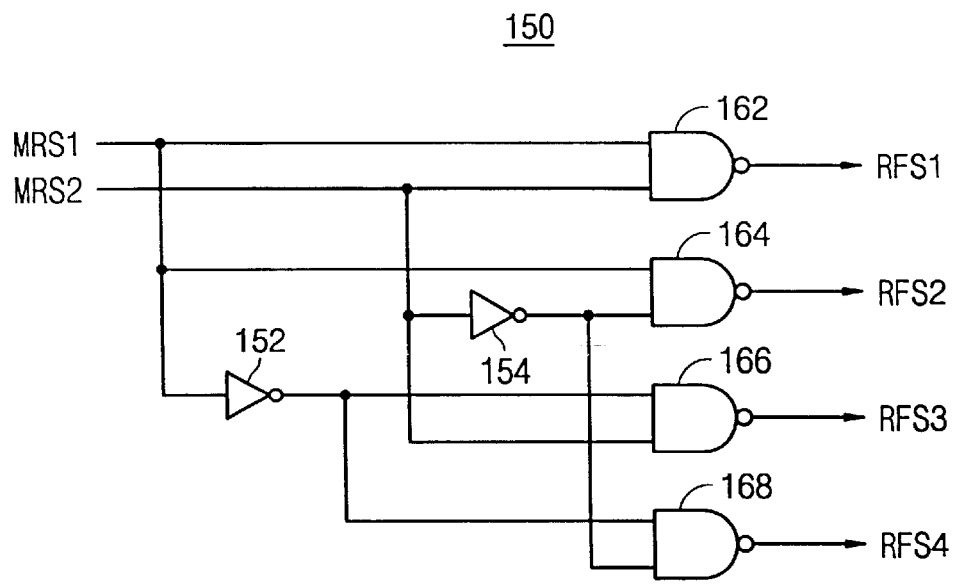
FIG. 5A shows an embodiment of a refresh period select circuit illustrated in FIG. 4.

FIG. 5A is a circuit diagram of an embodiment of the refresh period select circuit 150. This embodiment of the refresh period select circuit 150 includes two inverters 152 and 154 and four NAND gates 162, 164, 166 and 168 connected as illustrated in FIG. 5A. The refresh period select circuit 150 receives the decoded signals MRS1 and MRS2 from the mode register set 140 and generates refresh period select signals RFS1 to RFS4. One of the signals RFS1 to RFS4 is activated (low), and the remaining signals are inactivated (high). Alternatively, the refresh period select circuit 150 could be configured so that the activated signal is high and remaining signals are low. Refresh counter 18 performs automatic refresh operations according to a refresh period corresponding to the activated one of the refresh period select signals. Conventional clock and frequency divider circuits can be employ in or with refresh counter 18 to trigger the refresh operations at times according to the refresh period that the activated one of signal RFS1 to RFS4 selects.

Figure 5B:
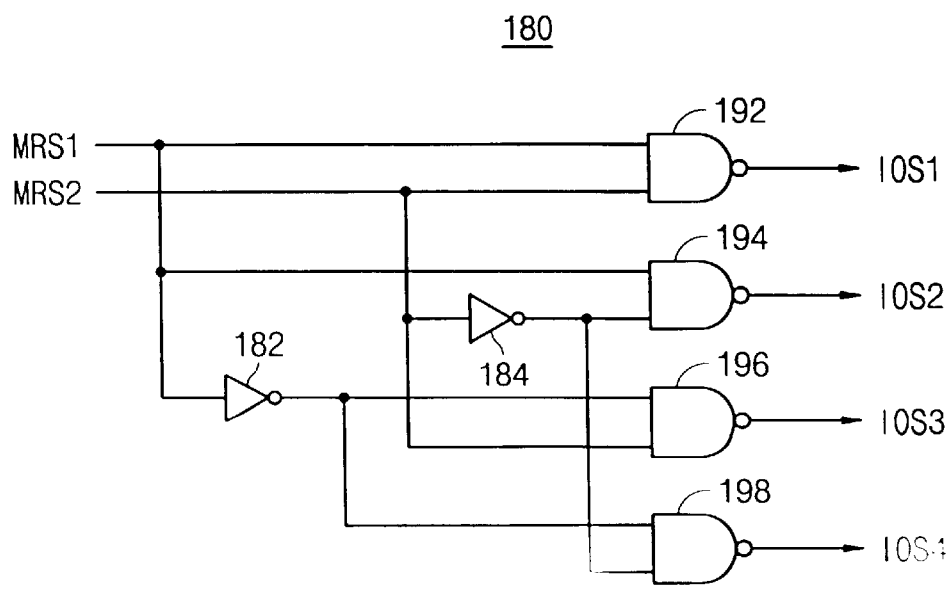
FIG. 5B shows an embodiment of a bit organization select circuit illustrated in FIG. 4.

FIG. 5B shows an embodiment of the bit organization select circuit 180. The bit organization select circuit 180 includes two inverters 182 and 194 and four NAND gates 192, 194, 196 and 198 connected as illustrated in FIG. 5B. The bit organization select circuit 180 receives the decoded signals MRS1 and MRS2 from the programming register 140 and generates bit organization select signals IOS1 to IOS4. One of the signals IOS1 to IOS4 is activated (low), and remaining signals are inactivated (high). Alternatively, the bit organization select circuit 180 can be configured so that the activated signal is high and the inactivated signals are low.

The data input multiplexer 126, which receives data signals from the data input buffer 124 during a write operation, selects a set of signals for writing to the memory cell array 110. The data output multiplexer 132, which receives data signals from sense amplifiers 130 during a read operation, selects a set of signals that the data multiplexer 132 passes to the data output buffer 134. In both cases, the number of data bits selected depends on which of select signals IOS1 to IOS4 is activated, and the start of the data bits selected depends on a column address for the write or read operation. Implementations of multiplexers such as the data output multiplexer 132 and the data input multiplexer 126 are known in the art.

In the embodiments of FIG. 5A and 5B, the select circuits 150 and 180 receive and use the same decoded signals MRS1 and MRS2. In general, the refresh period and the bit organization are closely correlated. For example, a memory device is realized to have 1 K refresh period and ×16 bit organization, 4 K refresh period and ×16 bit organization, 2 K refresh period and ×4 bit organization, 2 K refresh period and ×8 bit organization, 4 K refresh period and ×8 bit organization, etc. The embodiments of FIGS. 5A and 5B use two decoded signals MRS1 and MRS2 and select from among four possible combinations of refresh period and bit organization. Alternatively, more than two decoded signals and four alternative combinations can be provided, or the refresh period can be selected independently from the bit organization. In particular, the select circuit 150 can receive from the programming register circuit 140 decoded signals that differ from those that the select circuit 180 receives.

Figure 6:
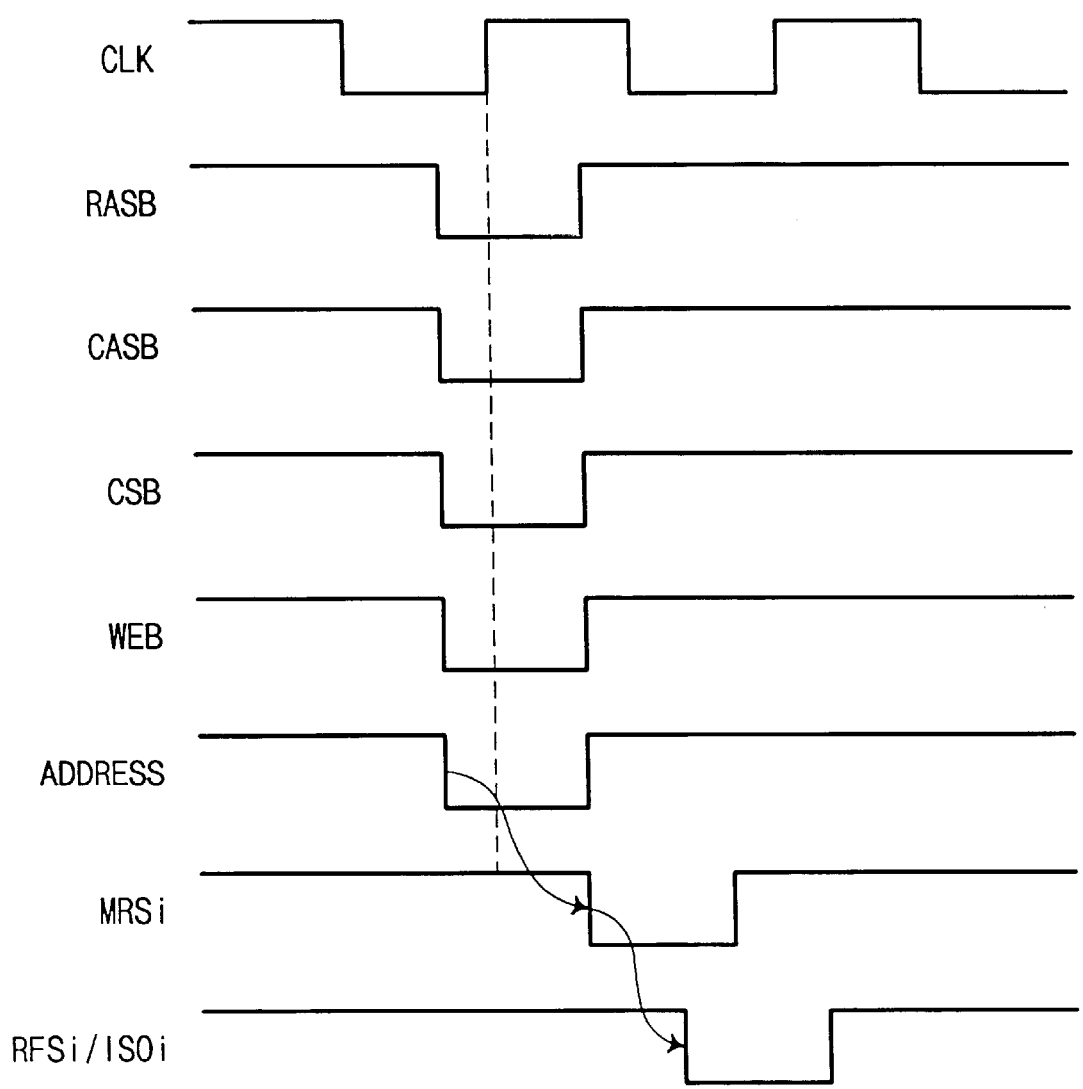
FIG. 6 is a timing diagram illustrating a refresh period and bit organization select operation according to an embodiment of the present invention.

In operation of the exemplary embodiment, the mode register set circuit 140 is programmed according an address values when control signals RASB, CASB, CSB and WEB simultaneously transition from a high level to a low level as illustrated in FIG. 6. The mode register set circuit 140 thus programmed outputs the decoded signals MRS1 and MRS2. The refresh period select circuit 150 activates one of the output signals RFS1 to RFS4 in response to the signals MRS1 and MRS2 from the programming register 140. A refresh period of the refresh counter 118 is determined by which of signals RFS1 to RFS4 is activated. Similarly, the bit organization select circuit 180 activates one of the signals IOS1 to IOS4 in response to the decoded signals MRS1 and MRS2 from the programming register 140. The activated one of the signals IOS1 to IOS4 determines a bit organization for the multiplexers 126 and 132.

Figure 1:
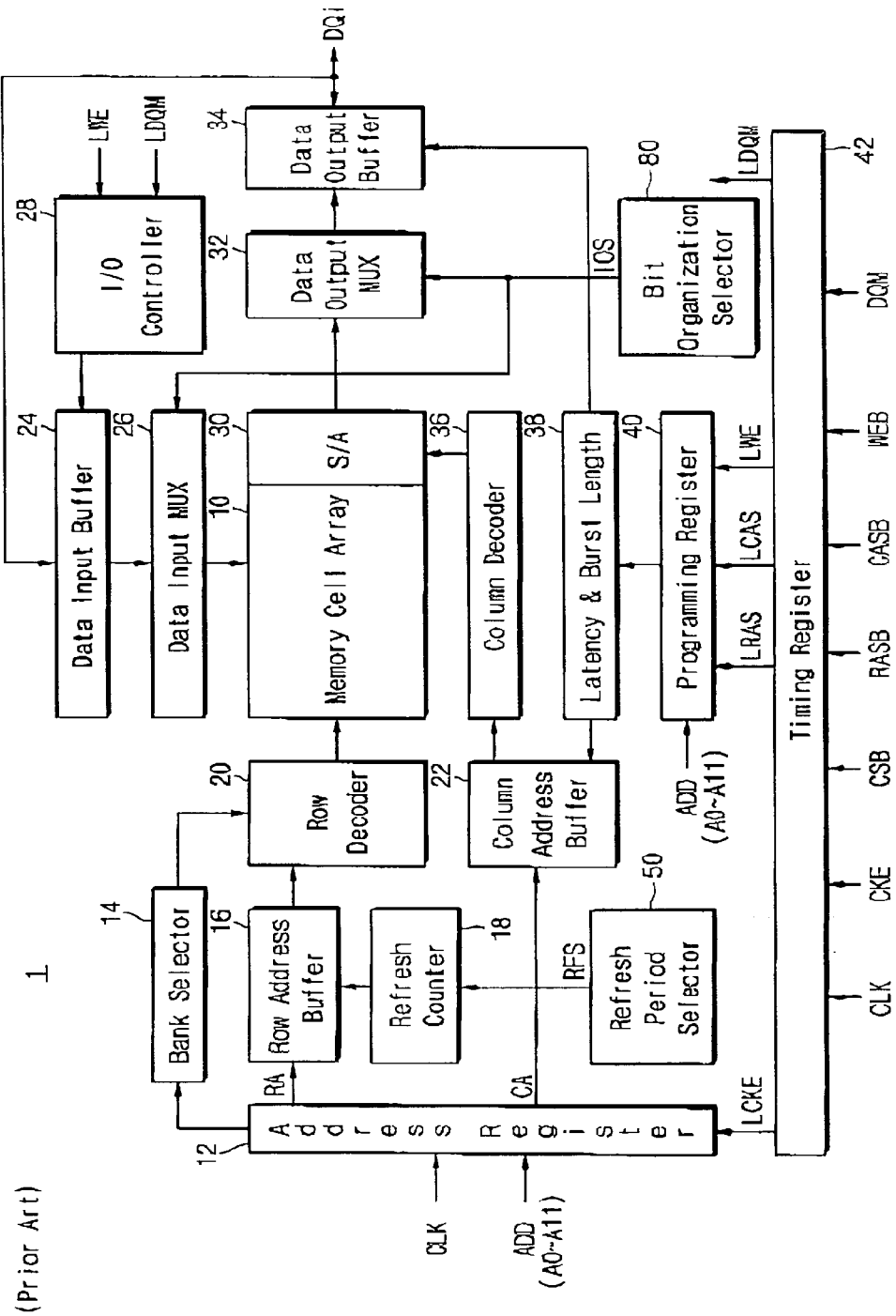
FIG. 1 shows a conventional dynamic random access memory device.
Figure 2:
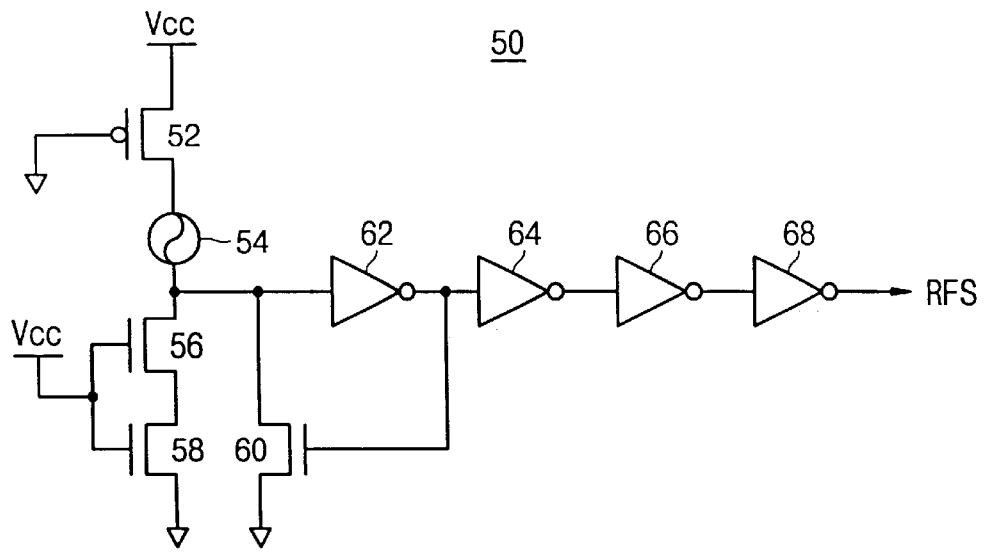
FIG. 2 is a circuit diagram of a refresh period select circuit illustrated in FIG. 1.
Figure 3:
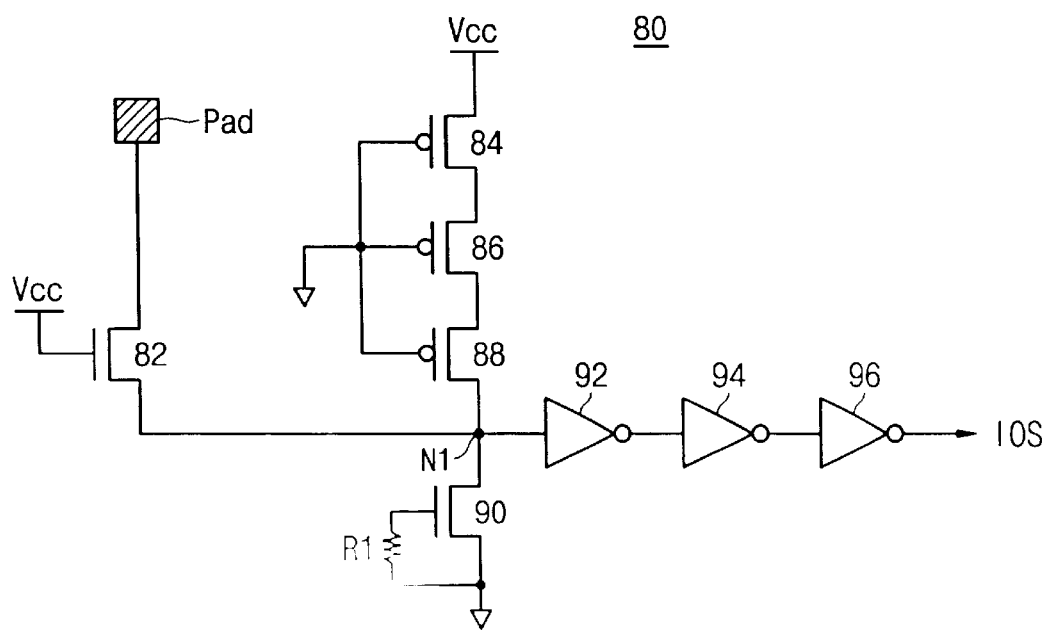
FIG. 3 is a circuit diagram of a bit organization select circuit illustrated in FIG. 1.

In the conventional memory of FIG. 1, determining the refresh period and the bit organization using a fuse option circuit, a metal option, or a bonding option may effect a chip's compatibility and efficiency owing to the characteristic of the option circuit. However, in the memory 100 of FIG. 2, the circuits for determining the refresh period and the bit organization are programmable, and the memory 100 can change the refresh period and the bit organization when necessary.

The invention has been described using exemplary embodiments. However, the scope of the invention is not limited to the disclosed embodiments. Various modifications and arrangements are possible. Accordingly, the scope of the claims should be accorded the broadest interpretation so as to encompass all such modifications and arrangements.

What is claimed is:

1. A random access memory device comprising:
   an array of memory cells arranged in rows and columns;
   a row selector that selects one of the rows in response to a row address;
   means for generating a plurality of refresh period select signals in response to a mode set command; and
   means for generating the row address according to a refresh period during a refresh operation, wherein the refresh period is determined by an activated one of the refresh period select signals.

2. The random access memory device according to claim 1, wherein the means for generating a plurality of refresh period select signals comprises a register.

3. The random access memory device circuit according to claim 2, wherein the register is programmed according to an address supplied at an input of the mode set command; and wherein the register outputs decoded signals identifying which of the refresh period select signals is to be activated.

4. The random access memory device according to claim 3, wherein the means for generating a plurality of refresh period select signals further comprises a signal generator which receives the decoded signals and generates the refresh period select signals in response thereto, wherein one of the refresh period select signals is activated according to programming of the register.

5. A random access memory device comprising:
   an array of memory cells arranged in rows and columns;
   a plurality of sense amplifiers for reading data from the array during a read operation;
   means for generating a plurality of bit organization select signals in response to a mode set command;
   a mode set command generator that generates the mode set command for the means for generating the plurality of bit organization select signals and for a refresh circuit for generating a plurality of refresh period select signals; and
   a data output multiplexer for selecting a part of the data in the plurality of sense amplifiers according to which of the bit organization select signals is activated.

6. The random access memory device according to claim 5, wherein the means for generating a plurality of bit organization select signals comprises a register storing a value identifying the activated one of the bit organization select signals.

7. The random access memory device according to claim 6, wherein the register is programmed according to an address supplied during input of the mode set command; and wherein the register outputs decoded signals for selecting a bit organization for the random access memory.

8. The random access memory device according to claim 7, wherein the means for generating a plurality of bit organization select signals further comprises a signal generator that receives the decoded signals and generates the bit organization select signals in response thereto, wherein one of the refresh period select signals is activated according to programming of the register.

9. A random access memory device comprising:
   an array of memory cells arranged in rows and columns;
   a row selector for selecting one of the rows in response to a row address;
   a plurality of sense amplifiers for reading data from the array during a read operation;
   a mode register set that provides decoded signals according to a value stored in the mode register set;
   a refresh period selector that generates a plurality of refresh period select signals in response to the decoded signals, wherein one of the refresh period select signals is activated;
   a refresh counter for generating the row address according to a refresh period determined by the activated refresh period select signal, during a refresh operation;
   a bit organization select circuit for generating a plurality of bit organization select signals in response to the decoded signals from the mode register set, wherein one of the bit organization select signals is activated; and
   a data output multiplexer for selecting a part of the data in the plurality of sense amplifiers according to the activated bit organization select signal during the read operation.

10. A random access memory device comprising:
    a mode register that provides a signal indicating a value stored in the mode register;
    a first selection circuit coupled to the mode register, wherein the first selection circuit in response to the signal from the mode register, selects a refresh period; and
    a second selection circuit coupled to the mode register that selects a data organization for the random access memory in response to the signal from the mode register.

* * * * *